US005287076A

United States Patent [19]

Johnescu et al.

[11] Patent Number: 5,287,076

[45] Date of Patent: Feb. 15, 1994

[54] DISCOIDAL ARRAY FOR FILTER CONNECTORS

[75] Inventors: Douglas M. Johnescu, Gilbertsville; Gary C. Toombs, Oneonta; Leoanrd A. Krantz, Sidney, all of N.Y.

[73] Assignee: Amphenol Corporation, Wallingford, Conn.

[21] Appl. No.: 707,095

[22] Filed: May 29, 1991

[51] Int. Cl.$^5$ .............. H03H 7/00

[52] U.S. Cl. .............. 333/182; 333/183; 361/302

[58] Field of Search .............. 333/182, 183, 181, 184, 333/185, 167, 12; 361/302, 329, 301, 303, 307, 328, 330; 439/607-610, 620

[56] References Cited

U.S. PATENT DOCUMENTS

| | | | |
|---|---|---|---|
| 3,538,464 | 11/1970 | Walsh | 333/79 |
| 3,569,915 | 3/1971 | Sorensen | 339/143 |
| 3,790,858 | 2/1974 | Brancaleone et al. | 317/99 |
| 3,825,874 | 7/1974 | Peverill | 3339/14 R |
| 4,079,343 | 3/1978 | Nijman | 333/79 |
| 4,083,022 | 4/1978 | Nijman | 333/183 X |
| 4,148,003 | 4/1979 | Colburn et al. | 333/181 |
| 4,275,945 | 6/1981 | Krantz et al. | 339/147 R |
| 4,458,220 | 7/1984 | Carter et al. | 333/182 |
| 4,494,092 | 1/1985 | Griffin | 333/182 |
| 4,741,710 | 5/1988 | Hogan et al. | 439/620 |
| 4,768,977 | 9/1988 | Gliha, Jr. et al. | 439/620 |
| 4,950,185 | 8/1990 | Boutros | 439/620 |
| 4,954,794 | 9/1990 | Nieman et al. | 333/182 |
| 5,153,540 | 10/1992 | Gliha, Jr. | 333/182 |

FOREIGN PATENT DOCUMENTS

| | | | |
|---|---|---|---|
| 870243 | 5/1971 | Canada | 333/39 |
| 0070683 | 1/1983 | European Pat. Off. . | |
| 2190548 | 11/1987 | United Kingdom . | |

*Primary Examiner*—Robert J. Pascal
*Assistant Examiner*—Ali Neyzari
*Attorney, Agent, or Firm*—Bacon & Thomas

[57] ABSTRACT

A capacitor array for filter connectors includes a stamped and formed ground resilient metal plate. Integral tines are provided to establish a solderless electrical connection between the plate and a connector shell. The filter elements are discoidal capacitors having cylindrical inner and outer electrode portions. The filter assembly is completed by soldering the outer electrode portions to the ground plate, while a solderless electrical connection between the inner electrodes and the feedthrough contacts of a connector is established by providing compliant sections on the contacts. A pi filter array is formed using two of the ground plates.

20 Claims, 3 Drawing Sheets

DISCOIDAL ARRAY FOR FILTER CONNECTORS

BACKGROUND OF THE INVENTION

1. Field of the Invention

The present invention relates to electrical connectors and in particular to an electrical connector filter assembly.

2. Description of the Related Art

It is known to provide filters in electrical connectors for the purpose of protecting sensitive electronic components from currents and voltages which develop in a transmission cable due to electromagnetic and radio frequency interference. It is further known to use capacitive or tuned pi circuits for the purpose of shunting the transients to ground without affecting the primary signal carried by the cable. Because such filter components generally require special handling, however, which greatly increases the cost of assembling the connectors, use of filter connectors has heretofore been restricted to specialized applications in which the need for filtering outweighs cost considerations. Nevertheless, electromagnetic and radio frequency fields are everywhere, and therefore virtually all applications involving cable connections between electronic devices could benefit from the addition of input filtering using filter connectors. For example, while filter connectors have been relatively widely employed in military aircraft, they have yet to gain widespread acceptance from commercial and civilian aircraft manufacturers due to the costs involved, even though commercial and civilian aircraft are subject to much of the same electrical interference fields as are military aircraft.

A main problem in assembling a filter connector lies in establishing electrical connections between the individual filter elements and the signal carrying connector contacts on the one hand, and between the filter elements and a common ground on the other. It is of course essential that all electrical connections be secure, with as low an impedance as possible, but it is also desirable for the connections to be releasable, permitting in situ testing and subsequent repair of the filter component without having to discard the entire connector prior to completion of the connector by potting.

This problem would not be difficult to overcome, except that the connectors in question have become extremely small, with contact densities on the order of 0.09". A typical connector having a diameter of approximately 1" may carry more than 50 feedthrough signal contacts, each contact requiring filtering. The problem of providing a filter for each contact is simplified somewhat by using monolithic filter elements, in which the filter elements are in the form of blocks of dielectric material with buried interleaved electrodes, but such filter elements are fragile, relatively expensive, and difficult to customize for specific applications. In addition, monolithic filter elements are subject to design problems involving cross-talk, hole-to-hole capacitance, ground resistance and control of the capacitance of non-filter holes. These problems arise because the live electrodes in each of the holes are separated from each other only by the dielectric material, and because each hole, whether filtered or not, is surrounded by the dielectric.

A variety of filter connector designs have been proposed which offer partial solutions to the above problems. These include the designs shown in U.S. Pat. Nos. 4,954,794, 4,950,185, 4,741,710, 4,768,977, 4,494,092, 4,458,220; 4,275,945; 4,083,022; 4,079,343; 3,790,858; 3,569,915; 3,825,874; and 3,538,464. As noted above, however, none of these numerous designs has resulted in mass acceptance of filter connectors in contexts other than a few limited applications. Each of the designs in the above-noted patents offers advantageous features, but none combines all of these features with a view to optimizing the simplicity and ease of assembly of a high density filter connector.

BRIEF SUMMARY OF THE INVENTION

It is an objective of the invention to provide an improved connector filter array which may be assembled in a connector shell without requiring special handling techniques, and which is easily removable for repair or replacement after testing.

It is a second objective of the invention to provide an improved connector filter array utilizing low-cost discoidal capacitors in which the capacitors are electrically connected to a ground plate by individual circumferential ground electrodes, thus providing improved isolation between signal contacts while at the same time simplifying both the structure of the ground plate and the manner of electrical connection.

It is also an objective of the invention to provide a filter connector utilizing low-cost discoidal capacitors soldered to a ground plate having integral ground fingers for electrical connection to the shell, the ground plate and capacitors forming an integral unit, and which enables connection between the signal contacts and the filter array to be achieved by means of compliant sections on the contacts, thus permitting testing of the connector during assembly while minimizing both the number of parts required and the number of assembly steps.

It is another objective of the invention to provide a capacitor filter assembly which enables variation of capacitances and the use of insulated or non-filtered circuits and customized ground arrangements, by placing previously manufactured discoidal capacitors of various values, insulating devices and/or ground elements in any location on a single ground plate as required by the application, with a minimum of down time, retooling, etc., and without any modification of the ground plate itself.

It is a further objective of the invention to provide a pi filter assembly for a connector, the pi filter assembly including two ground plate filter units and a plurality of ferrite inductor sleeves into which the signal contacts are inserted, each of the filter units being separately removable for testing and replacement during assembly.

It is a still further objective of the invention to provide a method of assembling a filter assembly and a connector in which the filter assembly is constructed as an integral unit by stamping and forming a metal plate to include signal contact apertures and integral ground tines around the periphery of the plate, and subsequently soldering discoidal filter elements to the plate.

It is yet another objective of the invention to provide a method of assembling a filter connector in which a filter unit is inserted into the connector and secured by a solderless connection, the electrical connection between the signal contacts and the capacitors also being obtained by a solderless connection.

These objectives are achieved by providing, according to a preferred embodiment of the invention, a filter assembly which includes a stamped and formed metal plate of resilient conductive material including a plurality of feedthrough signal contact apertures and a plurality of tines extending radially outwardly from the periphery of the plate, the tines being bent to resiliently engage a connector shell and thereby establish electrical contact therewith.

Also according to the preferred embodiment of the invention, a plurality of discoidal filter elements are arranged on the plate such that central apertures of the filter elements are coaxial with the plate apertures. Electrical connection between the ground electrodes of the filter elements and the ground plate is effected by soldering portions of the ground electrode directly to the surface of the plate. As a result, no special modification of the plate is required, and connection may be established by simply placing the filter elements in position and soldering.

To further achieve the objectives of the invention and ensure that the signal contacts do not contact the ground plate, the ground plate apertures of the preferred embodiment have a diameter larger than the filter element apertures. On the other hand, because the filter elements rest on the surface of the ground plate, rather than being buried within the ground plate structure as is conventional in the case of discoidal capacitors, the outer diameters of the filter elements are, according to the preferred embodiment, greater than the ground plate aperture diameters.

Finally, according to the preferred embodiment of the invention, once the filter elements are soldered to the ground plate, assembly of the connector for testing involves simply inserting the ground plane into the connector, and the pins into the filters, both via solderless connections.

DETAILED DESCRIPTION OF THE PREFERRED EMBODIMENTS

Figure 1:
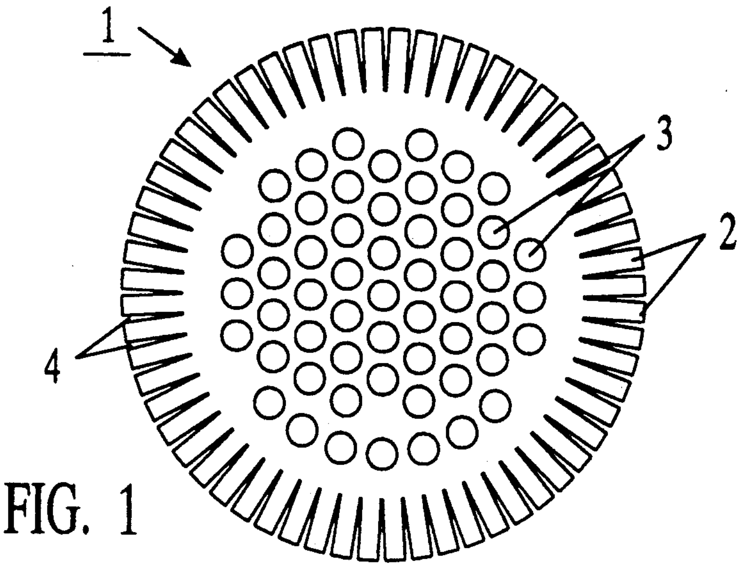
FIG. 1 is an elevated view of a ground plate for use in a filter assembly according to a preferred embodiment of the invention.
Figure 2:
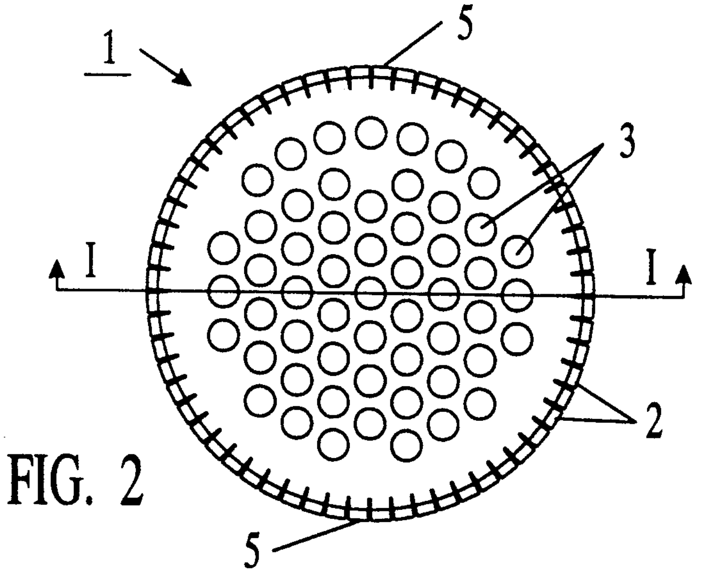
FIG. 2 shows the ground plate of FIG. 1 after bending of its integral spring tines.
Figure 3:
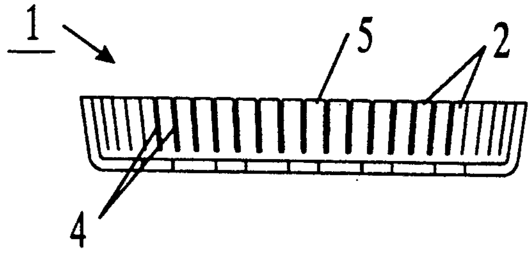
FIG. 3 is a cross-sectional side view taken along line I—I of FIG. 2.
Figure 4:
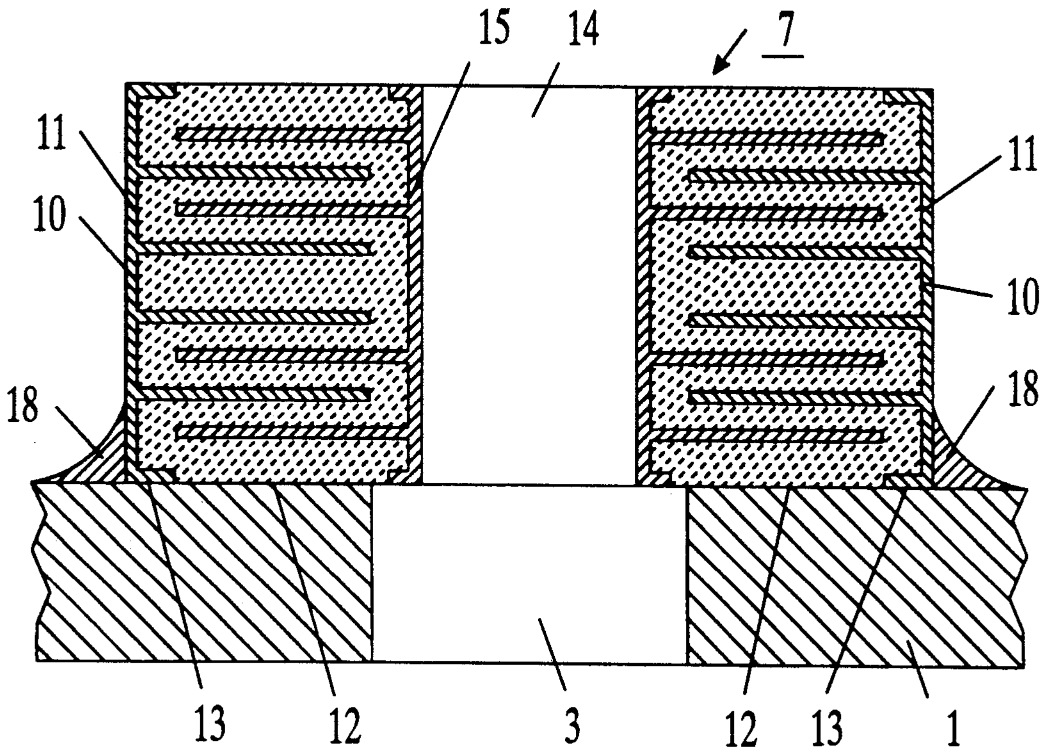
FIG. 4 is a cross-sectional side view showing the manner in which filter elements are mounted on the ground plate of FIGS. 1-3.
Figure 5:
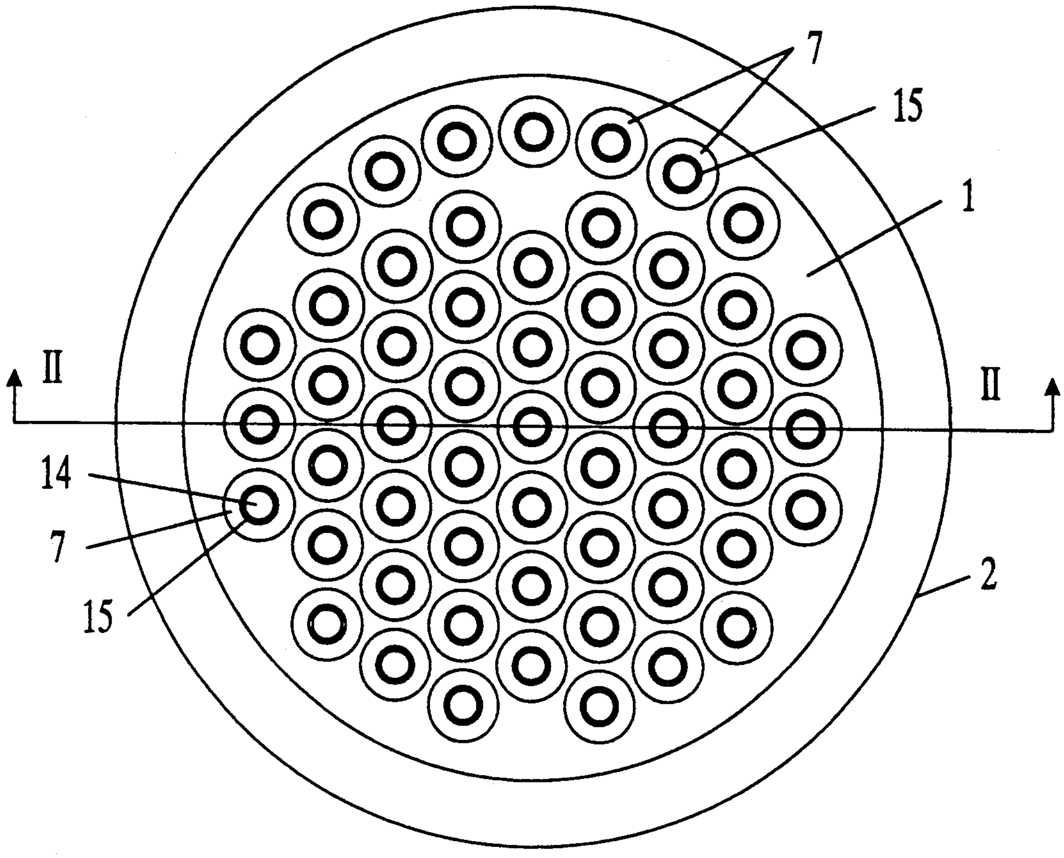
FIG. 5 is an elevated plan view of the filter assembly of FIGS. 1-4.

As shown in FIGS. 1-3, the preferred embodiment of the invention includes a ground plate 1 which is stamped and formed from a metal sheet to include a plurality of tines 2 provided for the purpose of establishing an electrical connection between the plate and the shell 16 of the connector, and a plurality of apertures 3 in which the feedthrough contacts of the connector are arranged as described in detail below.

A preferred material for the plate is phosphor bronze, although other resilient conductive materials may be substituted, for example beryllium copper. The purpose of providing a resilient metal plate is to impart a radially outwardly directed biasing force to the tines upon causing them to bend beyond the position shown in FIGS. 2 and 3 when inserting the ground plate in a connector, which causes the tines to securely engage the metal shell of the connector to ensure a good ground connection for the filter elements. Tines 2 are formed by stamping slots 4 in the periphery of a circular blank, as shown in FIG. 1, and then bending the tines to form an oblique angle in respect to a principal plane of the plate, as shown in FIGS. 2 and 3, such that the distance between diametrically opposite shell-engaging distal portions 5 of the tines is larger than an inner diameter of the connector shell at the point where the inserted plate contacts the shell to establish an electrical connection between the plate and the shell 16. A radially outwardly directed biasing force is thus obtained upon insertion of the plate into the shell, as a result of the consequent deflection of the tines in a radially inward direction.

The use of stamped and formed continuous spring tines about the periphery of the ground plate has several advantages. In addition to permitting solderless assembly of the ground plate into the connector shell, the spring arrangement possesses low inductance due to the existence of multiple parallel ground paths, and low resistance due to the existence of multiple independent ground paths. The filter array can be tested in the connector shell and then removed for repair if necessary prior to potting.

After stamping and forming the ground plate, the filter assembly is completed by soldering discoidal filter elements to the ground plate so that inner apertures of the filter elements through which the feedthrough signal contacts pass are substantially coaxial with the centers of the apertures in the ground plate.

In the illustrated example, the filter elements are pre-manufactured discoidal capacitors, including outer electrodes 10 made up of circumferential portions 11 and lower portions 13 extending along planar annular surface 12. The capacitors are electrically connected to plate 1 via solder fillets 18, which connect plate 1 to electrode portions 11 and 13, thus permitting the capacitors to be connected to the plate by simply aligning the capacitors and soldering. It will of course be appreciated that, in this arrangement, the outer diameters of the capacitors must be greater than the diameters of the ground plate apertures as shown, and that the solder fillets should substantially surround the capacitors.

By using pre-manufactured discoidal capacitors, in combination with the preferred ground plate structure, several advantages are obtained. First, it is possible to use a wide variety of different discoidal capacitor structures having different capacitance values on the same ground plate. In addition, it is very easy to vary the arrangement of capacitors, other filter elements, non-filtered circuits, and directly grounded circuits. For example, pins may be directly connected to the ground plate by conductive metal sleeve elements or springs, resulting in greatly reduced ground resistance. Also, it will be appreciated that because the ground electrodes and ground plate tend to electrically isolate individual filtered contacts, cross-talk and hole-to-hole capacitances are greatly reduced.

In order to establish electrical contact between the contact pins 6 and cylindrical live electrodes 15 of capacitors 7, which are located on the surfaces of apertures 14, contact pins 6 are provided with compliant sections 8 having a diameter which is larger than the diameter of apertures 14. When contacts 6 are inserted into capacitors 7 through apertures 14, compliant sections 8 flex radially inward, the restoring force on the compliant sections serving to ensure good electrical contact between contacts 6 and electrodes 15 of capacitors 7. It will be appreciated that the preferred solderless contact arrangement will work best if the diameters of apertures 3 are sufficiently large that the compliant sections do not touch the ground plate.

Figure 6:
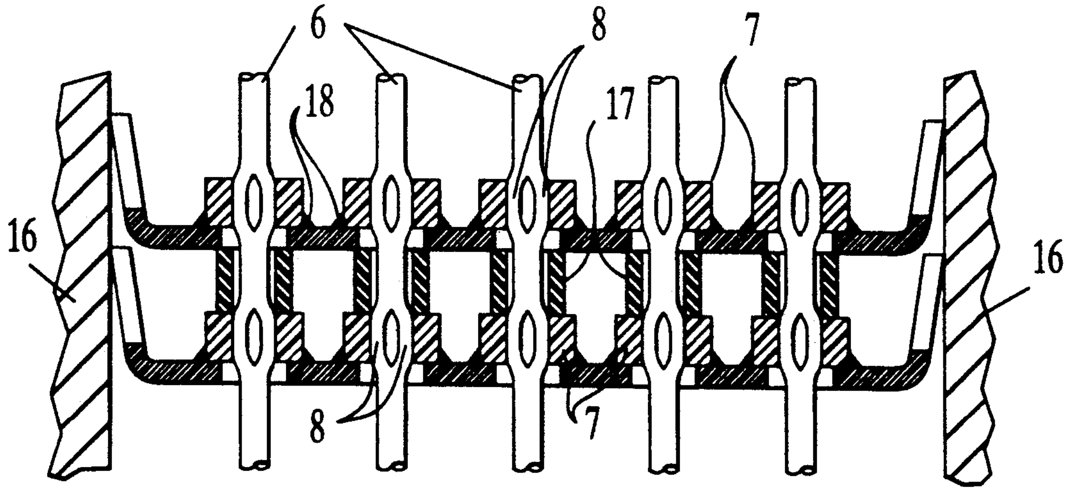
FIG. 6 is a cross-sectional side view of a connector taken along line II—II of FIG. 5 and showing the manner in which the filter assembly of FIG. 3 is arranged to form a connector pi filter assembly.

In order to complete a pi filter assembly, two of the capacitor arrays are used as shown in FIG. 6. The inductors are preferably in the form of ferrite inductor sleeves 17 sandwiched between the capacitive filter structures as is known in the art, although numerous other inductor structures may be substituted. The assembly is then oriented by an insert (not shown) keyed to a key on the shell or by a key in a tool. Numerous suitable insert structures are known to those skilled in the art for the purpose of providing support, shock protection, alignment, and environmental sealing for connector filter assemblies.

Assembly of the above-described structures is accomplished by soldering the capacitors to the plates, preferably by using solder pads, subsequently inserting feedthrough contact pins into central apertures of the capacitors, adding appropriate support inserts, and inserting the assembly into the shell to cause tines on the ground plate to deflect and establish an electrical connection between the ground plate and the shell. Once inserted, the filter may be tested and, if the tests are satisfactory, secured within the shell by potting, dielectric inserts, or similar means. If the filter fails the tests, then the filter assembly or individual contacts may easily be removed for repair or replacement.

It will be appreciated by those skilled in the art that variations of the invention are possible, for example in the manner in which electrode portions 13 are electrically connected to plate 1, or in the manner in which the tines on plate 1 are formed, and it is therefore intended that the invention be limited only by the appended claims.

We claim:

1. A filter assembly for an electrical connector, comprising:

a metal ground plate of resilient conductive material including means defining a plurality of apertures in said ground plate; grounding means for electrically connecting said plate to a shell of a connector; and a plurality of discoidal filter elements affixed on a surface of said plate such that a principal axis of each of said filter elements extends through a center of a respective one of said apertures, wherein each of said discoidal filter elements comprises an inner electrode defining a central aperture of said filter element, and an outer electrode; and ground electrode connection means for electrically connecting each of said outer electrodes to said surface of said plate.

2. A filter assembly as claimed in claim 1, wherein said filter elements are capacitors and said outer electrode substantially surrounds each of said capacitors, whereby said outer electrodes serve to electrically isolate said capacitors from each other.

3. A filter assembly as claimed in claim 1, wherein said material is phosphor bronze.

4. A filter assembly as claimed in claim 1, wherein said material is beryllium copper.

5. A filter assembly as claimed in claim 1, wherein said ground plate is stamped and formed and said grounding means comprises a plurality of tines extend radially outwardly from a periphery of said plate and at an oblique angle in respect to a principal plane of said plate.

6. A filter assembly as claimed in claim 5, wherein a distance between diametrically opposite ones of peripheral ends of said tines is greater than an interior diameter of a connector into which said filter assembly is to be inserted, thereby causing said tines to be deflected inwardly upon insertion of the assembly into the connector.

7. An electrical connector, comprising:

a shell;

a stamped and formed metal plate of resilient conductive material including means defining a plurality of apertures in said plate and means including a plurality of tines extending radially outwardly from the periphery of the plate for establishing an electrical connection between said plate and said shell, said tines having principal axes extending at an oblique angle in respect to a principal plane of said plate; and a plurality of discoidal filter elements affixed on said plate such that a principal axis of each of said filter elements extends through a center of a respective one of said apertures, wherein each of said discoidal filter elements comprises a substantially cylindrical central aperture and a substantially cylindrical outer perimeter, a diameter of said central aperture being smaller than a diameter of a corresponding one of said plate apertures, and a diameter of said outer perimeter being larger than said diameter of a respective one of said plate apertures.

8. A connector as claimed in claim 7, wherein said discoidal filter elements are capacitors.

9. A connector as claimed in claim 7, wherein each of said discoidal filter elements comprise a cylindrical inner electrode defining a central aperture, and an outer electrode which includes a circumferential outer electrode portion surrounding said filter element, and wherein said outer electrode portion is soldered to a planar surface of said metal plate on which said filter element is positioned.

10. A filter assembly as claimed in claim 7, wherein said material is phosphor bronze.

11. A filter assembly as claimed in claim 7, wherein said material is beryllium copper.

12. A connector as claimed in claim 7, wherein said connector comprises a plurality of feedthrough contacts arranged to pass through said apertures, said contacts comprising resilient means for resiliently engaging respective inner electrodes of said filter elements to thereby establish an electrical connection between said at least one contact and said inner electrode, and to removably hold said contact in said aperture of said filter elements.

13. A connector as claimed in claim 12, wherein said resilient means comprise compliant section on said one of said contacts.

14. A connector as claimed in claim 12, further comprising inductor sleeves surrounding respective ones of said contacts, and a second stamped and formed metal plate of resilient conductive material including means defining a plurality of second apertures in said plate and plurality of second tines extending radially outward from the periphery of the plate, said second tines extending at an oblique angle in respect to a principal plane of said second plate; and at least one second discoidal filter element arranged on said second plate such that a principal axis of said filter element extends through a center of one of said second apertures, wherein said second discoidal filter element comprises a substantially cylindrical second central aperture and a substantially cylindrical second outer perimeter, a diameter of said second central aperture being smaller than a diameter of said one of said second plate apertures, and a diameter of said second outer perimeter being larger than said diameter of said one of said second plate apertures, and wherein said second discoidal filter element, one of said inductor sleeves, and one of said first discoidal filter elements together form a pi filter.

15. A method of assembling a connector filter assembly, comprising the steps of:

stamping and forming a metal plate to obtain a stamped and formed metal plate including a plurality of plate apertures and a plurality of resilient tines extending about the periphery of said plate;

bending said tines to extend at an oblique angle in respect to a principal plane of said plate;

aligning a cylindrical aperture of each of a plurality of discoidal filter elements with respective ones of said plate apertures; and electrically connecting and affixing outer electrode portions of said filter elements to a surface of said plate on which said filter elements are positioned.

16. A method as claimed in claim 15, wherein said step of connecting comprises the step of soldering said outer electrode portion to said plate.

17. A method of assembling a connector, comprising the steps of:

stamping and forming a metal plate to obtain a stamped and formed metal plate including a plurality of plate apertures and a plurality of resilient tines extending about the periphery of the plate;

bending said tines to extend at an oblique angle in respect to a principal plane of said plate;

electrically connecting and affixing outer electrode portions of a plurality of discoidal capacitors to said plate; and inserting said filter assembly into a connector such that said tines engage and are deflected radially inward by a shell of said connector to establish a positive electrical connection between said plate and said shell.

18. A method as claimed in claim 17, wherein said step of connecting comprises the step of soldering said outer electrode portions to said plate.

19. A method as claimed in claim 17, further comprising the step of inserting feedthrough contacts into central apertures of said filter elements such that compliant sections on said contacts deflect radially inward in response to engagement with substantially cylindrical inner electrodes of said capacitors to establish an electrical connection between said inner electrodes and said contacts.

20. A method as claimed in claim 19, further comprising the step of testing said connector before permanently fixing said plate, filter elements, and contacts in said connector, and removing said plate and filter elements or contacts if the connector fails a test.

* * * * *